United States Patent
Li et al.

(10) Patent No.: US 6,646,500 B2
(45) Date of Patent: Nov. 11, 2003

(54) INTEGRATED CIRCUIT HAVING AN FM DEMODULATOR AND METHOD THEREFOR

(75) Inventors: Junsong Li, Austin, TX (US); Jon D. Hendrix, Wimberley, TX (US); Raghu G. Raj, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 11 days.

(21) Appl. No.: 10/115,124

(22) Filed: Apr. 2, 2002

(65) Prior Publication Data

US 2003/0184368 A1 Oct. 2, 2003

(51) Int. Cl.[7] .............................. H03D 3/00; H04L 27/14
(52) U.S. Cl. ...................... 329/318; 329/325; 329/341; 329/343; 375/324; 375/327; 455/214; 455/295; 455/337
(58) Field of Search .................................. 329/300, 302, 329/315, 318, 320, 325, 341–343; 360/30; 375/324, 325, 327, 328, 334–339, 376; 455/208, 214, 295–297, 312, 337

(56) References Cited

U.S. PATENT DOCUMENTS 4,752,955 A * 6/1988 Torick ........................ 381/13
5,697,084 A * 12/1997 Tingley .................... 455/276.1

OTHER PUBLICATIONS

Rosenkranz, "Design and Optimization of a Digital FM Receiver Using DPLL Techniques," IEEE, pp. 592–595 (1985).
Frerking, "Digital Signal Processing in Communication Systems," Kluwer Academic Publishers, Boston, pp. 257–261 (1993).

* cited by examiner

Primary Examiner—David C. Mis
(74) Attorney, Agent, or Firm—James L. Clingan, Jr.; Daniel D. Hill

(57) ABSTRACT

A digital FM demodulator employs a baseband phase lock loop (BBPLL), which is particularly effective for long range reception, for combining and demodulating a pair of signals represented by the mathematical expression $A(t)e^{j\theta(t)}$ to result in an approximation of $d\theta/dt$. This approximation is then subjected to an inverse of the linear approximation of the frequency response of the BBPLL that produces a very accurate $\theta$. This is conveniently achieved with a IIR filter whose transfer function happens to be the same as the inverse of the linear approximation of the frequency response of the BBPLL. The derivative is then taken of $\theta$ to produce a very accurate $d\theta/dt$, the desired result for the output of an FM demodulator. To aid operation of the BBPLL, the incoming digital intermediate frequency is upsampled by a combination of sample and hold and FIR filtering prior to being processed by the BBPLL.

20 Claims, 3 Drawing Sheets

US 6,646,500 B2

INTEGRATED CIRCUIT HAVING AN FM DEMODULATOR AND METHOD THEREFOR

FIELD OF THE INVENTION

This invention relates to digital FM radios and, more particularly, to digital FM demodulators useful in a digital FM radio.

RELATED ART

A digital FM radio typically includes an FM demodulator that outputs a signal for further baseband processing prior to being converted to an analog signal for driving speakers. A typical perspective with regard to the signals that are received by the FM demodulator is that there are two signals, I and Q, that represent the complex baseband FM modulated signal. These two signals are generally considered to be represented by $A(t)e^{j\theta(t)}$ where $A(t)$ is the amplitude and $\theta(t)$ is the phase angle of the FM modulated signal. The output of the FM demodulator is commonly called MPX, which is ideally $d\theta/dt$, but in actuality is typically a distorted version of $d\theta/dt$.

This distortion is manifested by a non-linear frequency response that results in sub-optimal FM stereo separation and some inter-symbol interference (ISI) in the FM digital sub-carriers such as radio data system (RDS) symbols. The RDS symbols are used for indicating traffic information and FM station identification information. Thus, the quality of the radio is directly affected by the degree to which the MPX signal is an accurate representation of $d\theta/dt$.

It is also desirable to achieve as much quality as possible in cases where the radio is distant from the source. A typical use of a radio is in automobiles so that it is common in such an application for the radio to move in and out of the range of a radio station's transmitter. Thus, it is desirable for radio to have both wide dynamic range and an accurate $d\theta/dt$, which has been difficult to achieve.

Thus, there is a need for a radio with an FM demodulator that provides for highly accurate $d\theta/dt$ and for wide dynamic range.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

The benefit of having a radio that provides both long distance reception and high quality $d\theta/dt$ is achieved with a digital baseband phase locked loop (BBPLL) that provides an output to a compensation circuit that, in one embodiment, combines an inverse of the linear approximation of the frequency response of the digital BBPLL and high quality differentiating. This is better understood with reference to the figures and the following description thereof.

Figure 1:
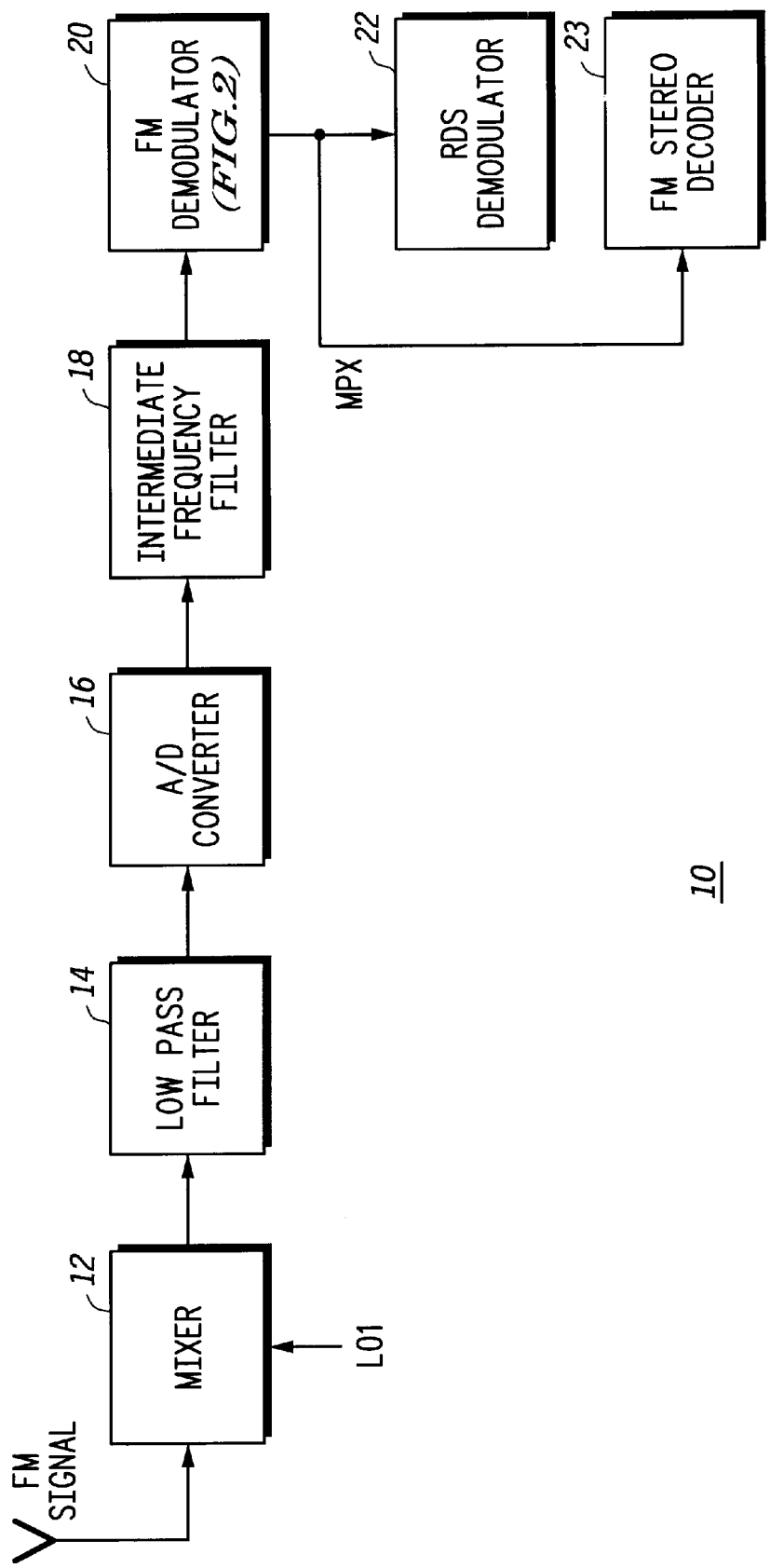
FIG. 1 is a block diagram of a radio using an FM demodulator according to a preferred embodiment of the invention.

Shown in FIG. 1 is an FM receiver 10 that is one of many possible uses for a demodulator such as the demodulator taught herein. In the illustrated form, an FM signal is received by an antenna and coupled to an input of a mixer 12. An output of mixer 12 is connected to a low pass filter 14. An output of low pass filter 14 is connected to an input of an A/D converter 16. An output of A/D converter 16 is connected to an input of an intermediate frequency filter 18. An output of the intermediate frequency filter 18 is connected to an input of an FM demodulator 20. An output of the FM demodulator 20 is connected to an input of an RDS demodulator 22 and an input of an FM stereo decoder 23.

In operation, mixer 12 takes a received input signal from the antenna and multiplies the input signal with a first local oscillator (LO) frequency, LO1. The resulting product is an intermediate frequency containing both a sum and a difference component. Low pass filter 14 removes the sum component and couples the difference component to A/D converter 16. The A/D converter 16 performs a conversion of the filtered signal to a digital format. The intermediate frequency filter 18 functions to digitally filter the signal to improve the signal-to-noise ratio. At the output of intermediate frequency filter 18 a substantially clean digital filtered intermediate frequency (IF) signal is presented to the FM demodulator 20. Since the received radio signal was frequency modulated in order to be transmitted, the FM demodulator 20 removes the frequency modulation from the received signal to reduce the signal to its informational content, often referred to as a multiplexed signal (MPX). Up to this point in the discussion, the described operation is conventional with respect to FM reception. When RDS information is transmitted within an FM signal, the MPX signal provided by the FM demodulator 20 will contain the RDS information. The RDS demodulator 22 functions to remove the RDS content from the demodulated output of FM demodulator 20. The FM stereo decoder functions to provide separate left and right audio signals.

Figure 2:
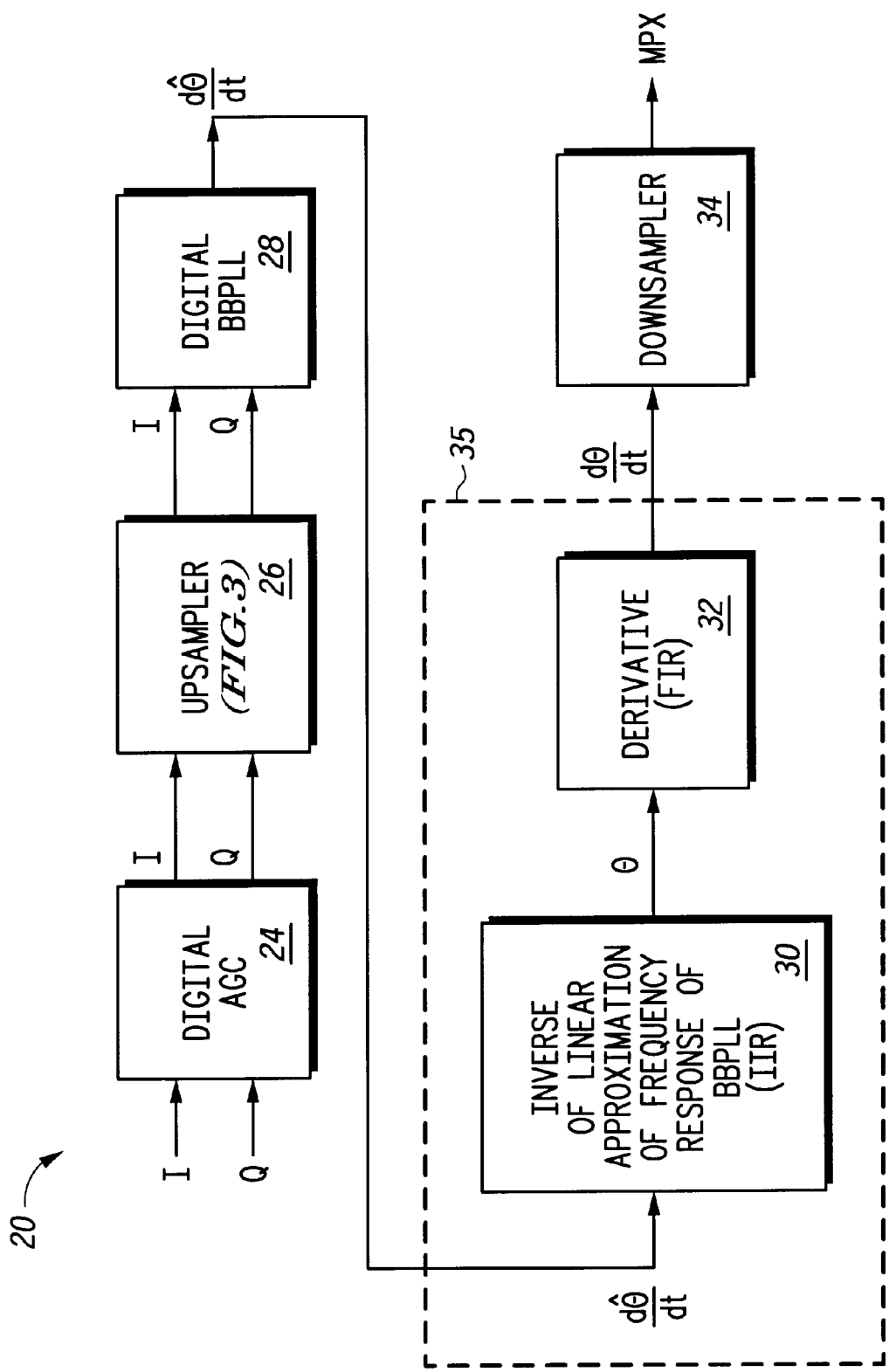
FIG. 2 is a block diagram of the FM demodulator according to the preferred embodiment of the invention.

Shown in FIG. 2 is FM demodulator 20 comprising a digital automatic gain control (AGC) 24, an upsampler 26, a digital BBPLL 28, an infinite impulse response (IIR) filter 30, a finite impulse response (FIR) filter 32, and downsampler 34. The IIR filter 30 and FIR filter 32 comprise a compensation circuit 35. In operation digital AGC 24 receives the two signals I and Q that together are effectively represented by the mathematical expression $A(t)e^{j\theta(t)}$. These two signals, I and Q, are quadrature components. The range of these I and Q signals as inputs to digital AGC 24 have a dynamic range of, for example, 70 dB. This may also be between 50 to 100 dB. Digital AGC 24 is designed, using known techniques, to provide a dynamic range for the output of the I and Q signals of only 0.1 dB and provide a gain-controlled IF signal. Upsampler 26, shown in more detail in FIG. 3, receives the I and Q signals from digital AGC 24 and increases the sampling frequency on its output of signals I and Q by a factor of, for example, four. Digital BBPLL 28 receives I and Q, the upsampled signals at the increased sampling frequency, which provides better tracking for BBPLL 28, and provides an approximation of $d\theta/dt$ that is shown as $$\frac{d\hat{\theta}}{dt}.$$

This approximation is not sufficient for high quality FM stereo separation and RDS reception. FIR filter 30 receives $$\frac{d\hat{\theta}}{dt}$$

and performs an inverse of the linear approximation of the frequency response of BBPLL 28. This results in an output of θ, or at least a highly accurate representation of θ. This output from FIR 30 is then differentiated by differentiator 32 to provide dθ/dt accurately. Downsampler 34 receives dθ/dt and reduces the sampling frequency by the same amount that upsampler 26 increased it; in this example, by four. Thus MPX is provided as a distortion-reduced demodulated signal.

These functional blocks 24, 26, 28, 30, 32, and 34 may be achieved by a series of digital signal processors (DSPs). Such DSPs have the requisite speed and functionality to achieve all of these functions using the circuitry present in the DSPs. DSPs have been used to achieve prior art digital FM demodulators. These functional blocks may also be achieved by programmable multiply/accumulate engines. These engines collectively have much the same function as a series of DSPs but not the same degree of flexibility. The extra flexibility has not been found to be necessary so it may be preferable to use the engines instead of DSPs. Similar to the use of DSPs, it is also known to one of ordinary skill in the art that FM demodulators may be made using multiply/accumulate engines.

The dynamic range of the digital AGC 24 is desirably selected to have a quite low dynamic range of 0.1 dB output. The reason is that the amplitude going into the digital BBPLL will affect its frequency response. Thus it is very desirable that the dynamic range on the input be as low as reasonably possible. With a dynamic range of only 0.1 dB, there is essentially no change in the frequency response of the BBPLL. Thus, it is not necessary to compensate for more than one frequency response. The dynamic range should be less than about 0.2 dB in order to avoid having more than one frequency response for which to provide compensation.

The digital BBPLL performs a mixing of the I and Q signals in the desired fashion as well as extracting the frequency information. The mathematical expression for the inverse of the BBPLL frequency response turns out to be the same as a first order IIR. Thus, an IIR is very convenient for achieving θ. After this IIR 30 provides θ, FIR 32 takes the derivative to provide the desired dθ/dt over the frequency band of interest, typically, zero to one hundred kilohertz. The use of BBPLL provides for excellent long range reception. For a given IF input, the BBPLL generally provides a higher tolerance for a lower signal to noise ratio. Thus, a benefit of this combination of structures is both long distance reception and high quality dθ/dt.

Figure 3:
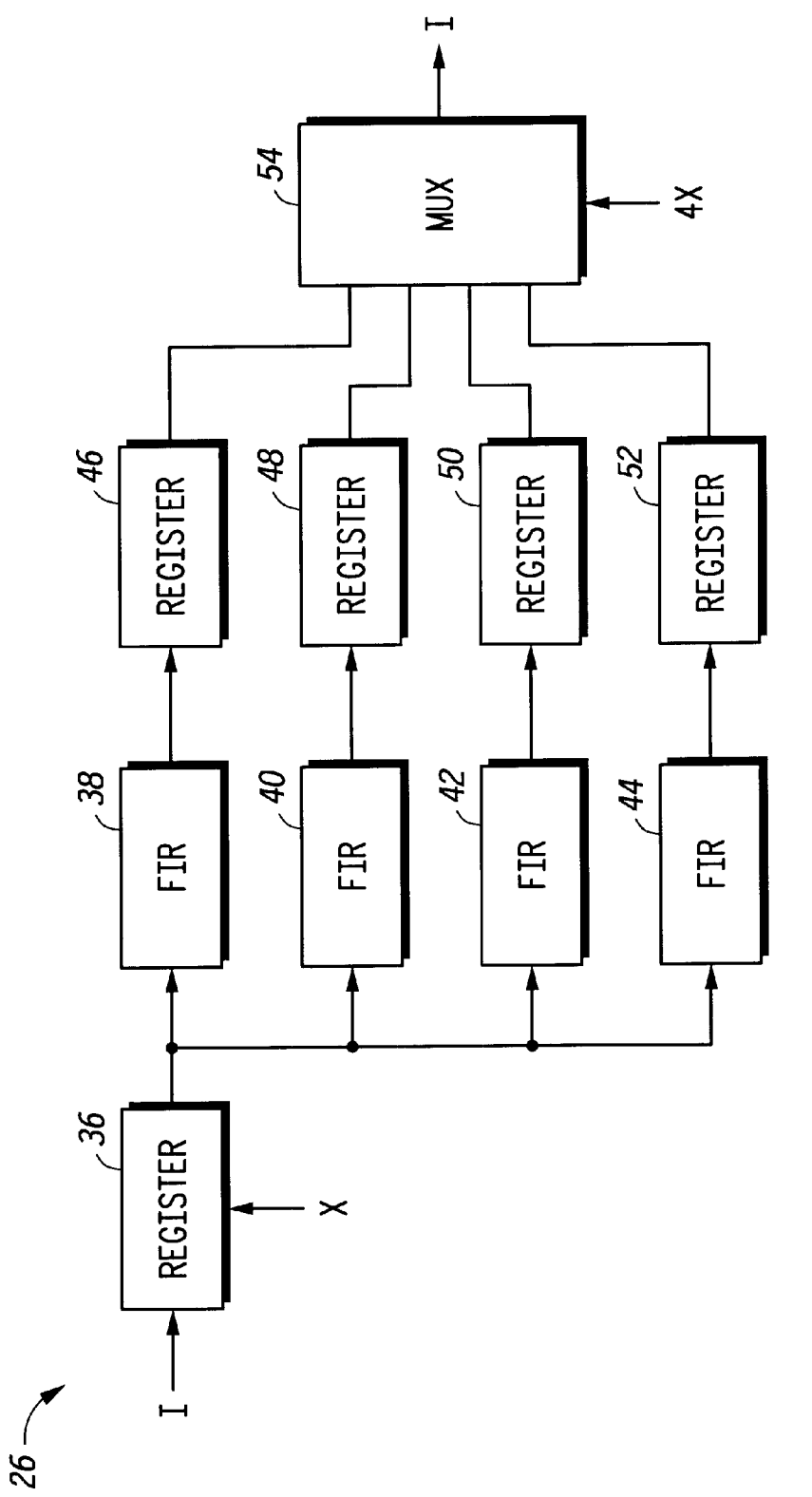
FIG. 3 is a block diagram of a portion of the FM demodulator of FIG. 2.

Shown in FIG. 3 is Upsampler 26 comprising FIRs 38, 40, 42, and 44; registers 36, 46, 48, 50, 52, and a multiplexer (MUX) 54. Register 36 receives signal I and stores it. This occurs at a clock rate x, which may be, for example, 240 kilosamples per second. This value is then processed by FIR filters (FIRs) 38–44, which are coupled in a parallel and to the output of register 36. The coefficients of each of FIRs 38–44 are selected in the manner that is known for case where the sample rate of the signal I is subject to be changed. This technique, known to one of ordinary skill in the art, reduces the amount of circuitry needed to be allocated to the FIRs by a factor of, for example, four compared to a standard FIR. This is the preferred approach but conventional FIRs will provide the desired functionality as well. Registers 46, 48, 50, and 52, coupled respectively to the outputs of FIRs 38, 40, 42, and 44, store the outputs of FIRs 38–44. Multiplexer 54 then consecutively selects registers 46–52 for outputting as signal I, the upsampled signal, at the rate of 4x, which may be, for example, 960 kilosamples per second. Signal Q is upsampled in the same way as for signal I and at the same time.

This technique for upsampling utilizes a sample and hold approach in conjunction with FIR type filtering. The sample and hold is provided by register 36. Thus, it is quite simple for a digital signal. The FIR filtering is simplified by using the polyphase technique known for simplifying FIR filters when changing the sample rate. This is thus a straightforward approach for providing the desired upsampling. One of the known disadvantages for using sample and hold in the digital domain alone for upsampling is the generation of images of the sampled signal. The FIR filtering is important in aiding in suppressing these undesired images.

In the foregoing specification, the invention has been described with reference to specific embodiments. One of ordinary skill in the art, however, appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit, comprising:
   a digital automatic gain control (AGC) circuit for receiving a filtered intermediate frequency (IF) signal, and in response, providing a gain-controlled IF signal;
   an upsampler for receiving the gain-controlled IF signal, and for providing an upsampled signal;
   a digital phase-locked loop for receiving the upsampled signal, and in response, providing a demodulated signal; and
   a compensation circuit for receiving the demodulated signal, and in response, reducing a distortion in the demodulated signal to produce a distortion-reduced demodulated signal.

2. The integrated circuit of claim 1, wherein the upsampler comprises:
   an input register for periodically registering the gain-controlled IF signal at a first sample rate;
   a plurality of parallel-connected finite impulse response (FIR) filters, each FIR filter of the plurality of parallel-connected FIR filters having an input coupled to an output of the input register;
   a multiplexer having a plurality of input terminals, each of the plurality of input terminals being coupled to a corresponding one of the plurality of parallel-connected FIR filters, and the multiplexer having an output terminal for providing the upsampled signal at a second sample rate, the second sample rate being higher than the first sample rate.

3. The integrated circuit of claim 2, wherein the second sample rate is four times the first sample rate.

4. The integrated circuit of claim 1, wherein the compensation circuit comprises:
   a circuit for generating an inverse of a linear approximation of a frequency response of the digital PLL; and
   a circuit for generating a derivative of the inverse of the linear approximation of the frequency response of the digital PLL to provide the distortion-reduced demodulated signal.

5. The integrated circuit of claim 1, wherein the compensation circuit comprises:
   an infinite impulse. response (IIR) filter having an input for receiving the demodulated signal, and an output; and
   a finite impulse response (FIR) filter having an input coupled to the output of the IIR filter, and an output for providing the distortion-reduced demodulated signal.

6. The integrated circuit of claim 1, further comprising a downsampler having an input coupled to receive the distortion-reduced demodulated signal, and an output for providing a downsampled distortion-reduced demodulated signal.

7. The integrated circuit of claim 1, wherein the integrated circuit is part of a frequency modulated (FM) radio receiver.

8. The integrated circuit of claim 1, wherein the AGC circuit is characterized as having a relatively wide input dynamic range of about 50–100 dB (decibels) and a relatively narrow output dynamic range of less than about 0.2 dB.

9. An integrated circuit, comprising:
   a demodulator for receiving a modulated signal, and in response, providing a demodulated signal; and
   a compensation circuit for receiving the demodulated signal, the compensation circuit comprising:
      a first circuit for generating an inverse of a frequency response of the demodulator; and
      a second circuit for generating a derivative of the inverse of the frequency response of the demodulator, whereby the derivative has an improved linear frequency response within a predetermined frequency band.

10. The integrated circuit of claim 9, further comprising:
    a digital automatic gain control (AGC) circuit for receiving the modulated signal, and in response, providing a gain-controlled modulated signal;
    an upsampler coupled between the AGC circuit and the demodulator, the upsampler for receiving the gain-controlled signal at a first sample rate and for providing an upsampled gain-controlled signal at a second sample rate greater than the first sample rate.

11. The integrated circuit of claim 10, wherein the upsampler comprises:
    an input register for periodically registering the gain-controlled signal at the first sample rate;
    a plurality of parallel-connected finite impulse response (FIR) filters, each FIR filter of the plurality of parallel-connected FIR filters having an input coupled to an output of the input register;
    a multiplexer having a plurality of input terminals, each of the plurality of input terminals being coupled to a corresponding one of the plurality of parallel-connected FIR filters, and the multiplexer having an output terminal for providing the upsampled gain-controlled signal at the second sample rate.

12. The integrated circuit of claim 10, further comprising a downsampler having an input coupled to receive the derivative, and an output for providing a downsampled derivative at a third sample rate, wherein the third sample rate is equal to the first sample rate.

13. The integrated circuit of claim 10, wherein the compensation circuit comprises:
    an infinite impulse response (IIR) filter having an input for receiving the demodulated signal, and an output; and
    a finite impulse response (FIR) filter having an input coupled to the output of the IIR filter, and an output for providing the derivative.

14. The integrated circuit of claim 10, wherein the integrated circuit is part of a frequency modulated (FM) radio receiver.

15. The integrated circuit of claim 10, wherein the AGC circuit is characterized as having a relatively wide input dynamic range of about 50–100 dB (decibels) and a relatively narrow output dynamic range of less than about 0.2 dB.

16. A method for demodulating a frequency modulated (FM) signal, comprising the steps of:
    receiving a filtered intermediate frequency (IF) signal;
    providing a gain-controlled IF signal using an automatic gain control (AGC) circuit at a first sample rate;
    upsampling the gain-controlled IF signal to provide an upsampled signal at a second sample rate greater than the first sample rate;
    demodulating the upsampled signal using a digital phase-locked loop (PLL) to produce a demodulated signal; and
    compensating for a distortion in the demodulated signal to produce a distortion-reduced demodulated signal.

17. The method of claim 16, wherein the step of compensating further comprises the steps of:
    generating an inverse of a frequency response of the digital PLL; and
    generating a derivative of the inverse of the frequency response of the digital, whereby the derivative has an improved linear frequency response within a predetermined frequency band.

18. The method of claim 16, wherein the step of compensating further comprises the steps of:
    filtering the demodulated signal using an infinite impulse response (IIR) filter to produce a filtered demodulated signal; and
    filtering the filtered demodulated signal using a finite impulse response (FIR) filter to provide the derivative.

19. The method of claim 16, wherein the step of upsampling further comprises the steps of:
    periodically registering the gain-controlled signal at the first sample rate;
    providing a plurality of parallel-connected finite impulse response (FIR) filters, each FIR filter of the plurality of parallel-connected FIR filters having an input coupled to an output of the input register;
    providing a multiplexer having a plurality of input terminals, each of the plurality of input terminals being coupled to a corresponding one of the plurality of parallel-connected FIR filters, and the multiplexer having an output terminal for providing the upsampled gain-controlled signal at the second sample rate.

20. The method of claim 16, further comprising the step of downsampling the distortion-reduced demodulated signal at a third sample rate equal to the first sample rate.

* * * * *